(12) United States Patent
Mansour et al.

(10) Patent No.: US 9,407,068 B2
(45) Date of Patent: Aug. 2, 2016

(54) INTEGRATED BROADBAND QUANTUM CASCADE LASER

(71) Applicant: California Institute of Technology, Pasadena, CA (US)

(72) Inventors: Kamjou Mansour, LaCanada, CA (US); Alexander Soibel, South Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 189 days.

(21) Appl. No.: 13/722,981

(22) Filed: Dec. 20, 2012

(65) Prior Publication Data

US 2013/0121359 A1     May 16, 2013

Related U.S. Application Data

(63) Continuation-in-part of application No. 12/070,504, filed on Feb. 19, 2008, now abandoned.

(60) Provisional application No. 60/902,302, filed on Feb. 20, 2007.

(51) Int. Cl.
| | |
|---|---|
| *H01S 5/34* | (2006.01) |
| *H01S 5/40* | (2006.01) |
| *H01L 33/04* | (2010.01) |
| *B82Y 20/00* | (2011.01) |

(52) U.S. Cl.
CPC . *H01S 5/34* (2013.01); *B82Y 20/00* (2013.01); *H01L 33/04* (2013.01); *H01S 5/3402* (2013.01); *H01S 5/405* (2013.01); *H01S 5/4087* (2013.01)

(58) Field of Classification Search
CPC ............... H01S 5/3419; H01S 5/4043; H01S 5/3401–5/3402; H01S 5/4025–5/405; H01S 5/4087–5/4093
See application file for complete search history.

(56) References Cited

U.S. PATENT DOCUMENTS

| | | | | |
|---|---|---|---|---|
| 4,607,370 A | * | 8/1986 | Mukai | H01S 5/4043 372/46.01 |
| 5,228,050 A | * | 7/1993 | LaCourse et al. | 372/50.121 |
| 5,588,015 A | * | 12/1996 | Yang | H01S 5/34 257/22 |
| 5,995,529 A | | 11/1999 | Kurtz et al. | |
| 5,999,553 A | | 12/1999 | Sun | |
| 6,091,751 A | * | 7/2000 | Berger | H01S 5/3402 372/45.01 |
| 6,144,683 A | * | 11/2000 | Floyd | H01S 5/4043 372/45.01 |

(Continued)

OTHER PUBLICATIONS

Gmachl et al., "Quantum Cascade Lasers With a Heterogeneous Cascade: Two- and Multiple-Wavelength Operation", Proceedinas of SPIE vol. 4651 (2002),286-293.
Gmachl et al., "Single-Mode, Tunable Distributed-Feedback and Multiple-Wavelength Quantum Cascade Lasers". IEEE Journal of Quantum Elec., vol. 38, No. 6, (Jun. 2002).569-581.

(Continued)

*Primary Examiner* — Jessica Stultz
*Assistant Examiner* — Sean Hagan
(74) *Attorney, Agent, or Firm* — Canady & Lortz LLP; Bradley K. Lortz

(57) ABSTRACT

A broadband, integrated quantum cascade laser is disclosed, comprising ridge waveguide quantum cascade lasers formed by applying standard semiconductor process techniques to a monolithic structure of alternating layers of claddings and active region layers. The resulting ridge waveguide quantum cascade lasers may be individually controlled by independent voltage potentials, resulting in control of the overall spectrum of the integrated quantum cascade laser source. Other embodiments are described and claimed.

18 Claims, 6 Drawing Sheets

(56) References Cited

U.S. PATENT DOCUMENTS

| | | | |
|---|---|---|---|
| 2004/0256611 A1* | 12/2004 | Kim | H01S 5/343 257/13 |
| 2005/0232327 A1* | 10/2005 | Nomura | H01S 5/4043 372/50.12 |
| 2005/0286591 A1 | 12/2005 | Lee | |
| 2006/0280209 A1* | 12/2006 | Treusch et al. | 372/32 |
| 2007/0008999 A1 | 1/2007 | Breznay et al. | |

OTHER PUBLICATIONS

Straub et al., "Two-Wavelength Quantum Cascade Lasers With Heterogeneous Cascades", IEEE, (2002). 141-144.

Malis et al., "The Quantum Cascade Laser: A Versatile High-Power . . . ," Bell Labs Technical Journal, 10(3), (2005), 199-214.

* cited by examiner

INTEGRATED BROADBAND QUANTUM CASCADE LASER

CROSS-REFERENCE TO RELATED APPLICATIONS

This continuation-in-part application claims the benefit under 35 U.S.C. §120 of the following co-pending and commonly-assigned U.S. utility patent application:

U.S. patent application Ser. No. 12/070,504, filed Feb. 19, 2008, by Brandon et al. and entitled "INTEGRATED BROADBAND QUANTUM CASCADE LASER," which claims the benefit of U.S. Provisional Patent Application Ser. No. 60/902,302, filed Feb. 20, 2007, which applications are both incorporated by reference herein.

STATEMENT OF GOVERNMENT RIGHTS

The invention described herein was made in the performance of work under a NASA contract, and is subject to the provisions of Public Law 96-517 (35 U.S.C. 202) in which the Contractor has elected to retain title.

BACKGROUND OF THE INVENTION

1. Field of the Invention

The present invention relates to quantum cascade lasers, and quantum cascade lasers for broadband applications.

2. Description of the Related Art

Over recent decades, several sources with mid-infrared (IR) emission have been developed, including thermal IR sources, optical parametric oscillators (OPO), light emitting diodes (LED), cryogenically cooled lead-salt diode lasers (pb-salt), and quantum cascade (QC) semiconductor lasers. QC laser technology has been successfully demonstrated in the 4 to 150 μm wavelength range and is the only technology demonstrated to provide significant optical power over the entire wavelength range of interest. Thus, QC lasers have become the most promising sources in the mid- to far-infrared range. Compared with typical thermal IR sources, the wavelength coverage of a typical QC laser is inadequate due to its narrow waveband. In addition, such lasers are often too bulky, complex and are based on technology too unreliable for space applications. Thus, some other approach is needed to yield a miniaturized, compact, robust, and reliable broadband laser source in the mid-IR wavelength region.

Quantum cascade lasers are semiconductor devices that emit electromagnetic radiation in the mid-to far infrared frequency spectrum, with numerous applications, such as for example chemical monitoring, medical diagnostics, collision avoidance using lidar, and free space communication, to name just a few. Quantum cascade lasers are unipolar devices, where a single type of carrier, usually electrons, emit photons when transitioning from an energy band to a lower energy band. Energy bands are engineered with the use of quantum wells. A quantum cascade laser comprises a number of active regions, each active region including an injector region adjacent to a quantum well. Electrons tunnel through an injector region so as to be injected into an adjacent quantum well. The energy bands are structured such that an electron injected into a quantum well emits a photon when transitioning from an energy band to a lower energy band within that quantum well, where the electron then tunnels through the next injector to the next quantum well, where it again may transition from an energy band to a lower energy band within that next quantum well to emit another photon. This cascading process continues, and is one of the reasons why quantum cascade lasers are efficient sources of laser radiation.

For some applications, it is desirable to have a tunable broadband laser source. For example, a tunable broadband source may be of utility in probing gases for their chemical makeup, where the spectral content of the probing signal gives information about the chemical species, or may be of utility in a communication system, to name a couple of examples.

FIG. 1 illustrates in a simplified pictorial cross-sectional view a prior art quantum cascade laser for providing broadband radiation. In between cladding layers 102 and 104 are two active regions, each providing radiation at a different wavelength. For ease of illustration, only two active regions are illustrated in FIG. 1, active region 106 to provide radiation having a first wavelength ($\lambda_1$) and active region 108 to provide radiation having a second wavelength ($\lambda_2$). In practice, however, there may many active regions, each one providing electromagnetic radiation at a different wavelength. The index of refraction of cladding layers 102 and 104 are less than that of the active regions, so that the structure of layers 102, 104, 106, and 108 form a ridge waveguide. In the particular example of FIG. 1, a voltage potential is provided between metal layer 110 and substrate layer 112, and the electromagnetic propagation is along the z-axis direction as indicated by the XYZ coordinate system illustrated in FIG. 1.

Each active region in FIG. 1 includes an injector region with an adjacent quantum well. A quantum well may be referred to as gain region. The injector region usually is a superlattice. The layers making up the superlattice injector regions and the quantum wells are formed along the y-axis direction by various well-known techniques, such as molecular beam epitaxy. By including many active regions, each emitting electromagnetic radiation at a different wavelength, a broadband laser source may be synthesized. However, a problem with quantum cascade lasers of the type depicted in FIG. 1 is that it may be difficult to control the individual active regions. For example, some active regions may provide more power than other active regions, and it may be difficult to individually tune the active regions so as to provide a desired spectral laser output.

In view of the foregoing, there is a need in the art for apparatuses and methods for tunable broadband mid-infrared sources. e.g. employing quantum cascade lasers. Particularly, there is a need for such apparatuses and method to afford higher optical power, spectral density and brightness in comparison to the typical thermal IR sources in the 3 to 20 micron wavelength region. Particularly, there is a need for such apparatuses and methods to exhibit sufficient reliability and robustness for space applications. These and other needs are met by embodiments of the present invention as detailed hereafter.

SUMMARY OF THE INVENTION

A typical embodiment of the invention comprises a monolithic quantum cascade (QC) laser structure, including a plurality of active region layers formed with a common material, where each of the active region layers has a different thickness, a plurality of cladding layers vertically interleaved with the plurality of active region layers such that the plurality of cladding layers and the plurality of active region layers are alternating and a pair of the plurality of cladding layers bound each of the plurality of active region layers, and a substrate layer supporting and contacting a lowest one of the plurality of cladding layers. Each of the active region layers bounded by the pair of the plurality of cladding layers is etched to laterally isolate an active region layer portion between an upper bounding cladding layer portion and a lower bounding cladding layer to form a separately addressable one of a plurality of QC lasers. For each of the plurality of QC lasers, an index of refraction of the active region layer portion is greater than that of the upper bounding cladding layer portion and the lower bounding cladding layer. Typically, the common material of the plurality of active region layers comprises a superlattice semiconductor material structure, e.g. GaInAs/AlInAs (on a InP substrate), AlGaAs/GaAs (on a GaAs substrate), AlGaSb/InAs (on a GaSb substrate), or AlSb/InAs (on a GaSb substrate) heterostructures.

Emission from each separately addressable one of the plurality of QC laser may be activated by applying an independent voltage between an upper contact on the upper bounding cladding layer portion and a lower contact on the lower bounding cladding layer.

A distinct emission wavelength for each of the separately addressable one of a plurality of QC lasers is determined by the different particular thickness of each of the active region layers. Each of the separately addressable QC lasers may exhibit a relatively narrow band. e.g. less than 5 micron bandwidth around the particular distinct emission wavelength for the particular QC laser. However, these distinct emission wavelengths for all of the plurality of QC lasers may be multiplexed together to yield the broadband emission of the overall device. Typically, this broadband emission may comprise a greater than 15 micron bandwidth. Arrangement of the particular QC bandwidths in the overall structure can vary. For example, each of the active region layers may be disposed such that the different thickness is greater (or smaller) than that of any of the plurality of active region layers below. Alternately, the different bandwidths A typical method embodiment of the invention comprises a method of forming a monolithic quantum cascade (QC) laser structure, comprising the steps of growing a plurality of active region layers from a common material, where each of the active region layers has a different thickness, growing a plurality of cladding layers vertically interleaved with the plurality of active region layers such that the plurality of cladding layers and the plurality of active region layers are alternating and a pair of the plurality of cladding layers bound each of the plurality of active region layers, providing a substrate layer supporting and contacting a lowest one of the plurality of cladding layers, and etching each of the active region layers bounded by the pair of the plurality of cladding layers to laterally isolate an active region layer portion between an upper bounding cladding layer portion and a lower bounding cladding layer to form a separately addressable one of a plurality of QC lasers. This method embodiment of the invention may be further modified consistent with the apparatus embodiments described herein.

BRIEF DESCRIPTION OF THE DRAWINGS

Referring now to the drawings in which like reference numbers represent corresponding parts throughout.

DETAILED DESCRIPTION OF THE PREFERRED EMBODIMENT

1. Overview

In the description that follows, the scope of the term "some embodiments" is not to be so limited as to mean more than one embodiment, but rather, the scope may include one embodiment, more than one embodiment, or perhaps all embodiments.

Figure 1:
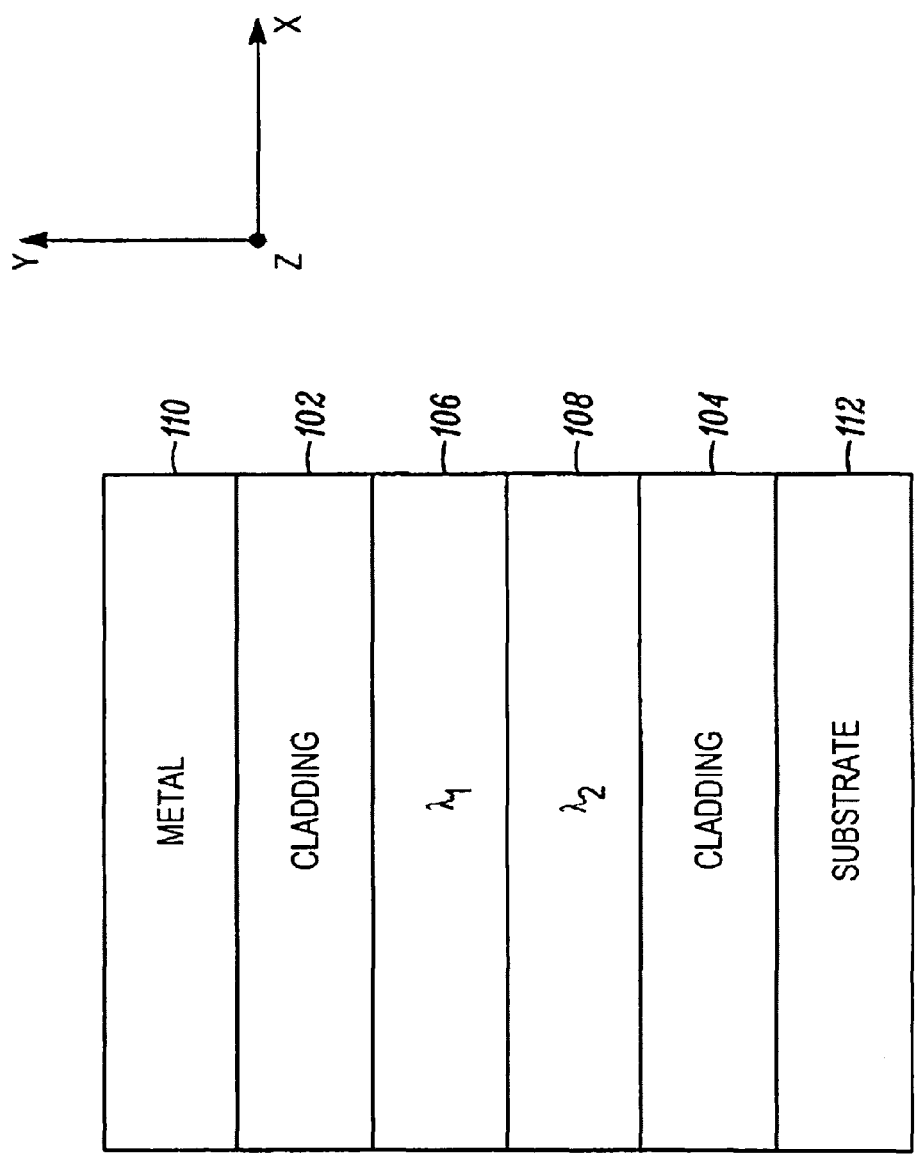
FIG. 1 illustrates a cross sectional view of a prior art multi-band quantum cascade laser.
Figure 2:
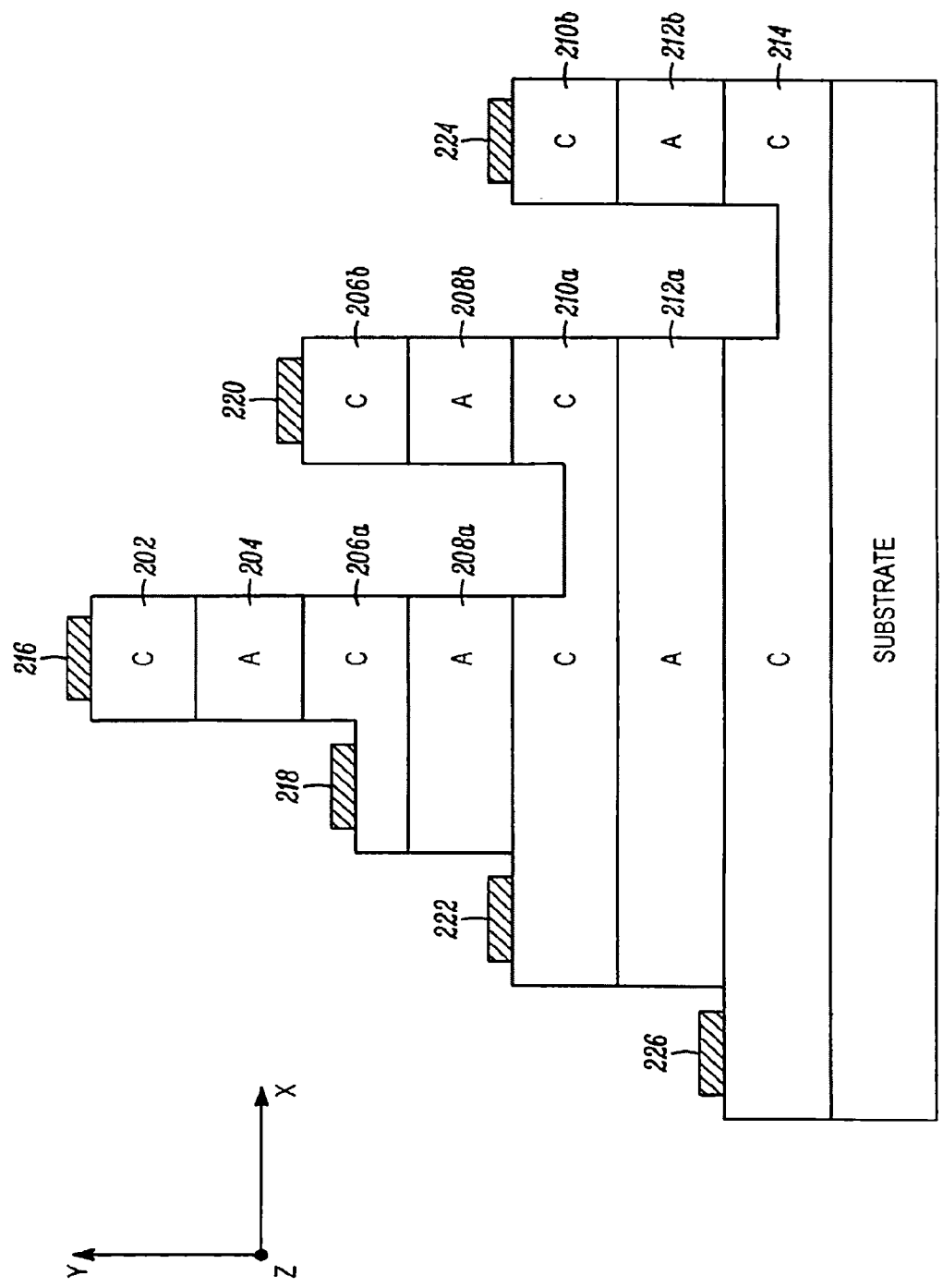
FIGS. 2 and 3 illustrate cross-sectional views of a quantum cascade laser according to an embodiment.

FIG. 2 illustrates is a simplified pictorial cross-sectional representation of a quantum cascade laser according to an embodiment, where for ease of illustration, only three ridge waveguide lasers are shown. In practice, there may be many individual ridge waveguide lasers, each emitting electromagnetic radiation at a different wavelength so as to provide a broadband source of radiation. It is a known property of quantum cascade lasers that emission wavelength may be controlled by the active layer thickness and one material may be used over a broadband wavelength range. A layer with a letter "c" denotes a cladding layer, and a layer with the letter "a" denotes an active layer, where an active layer includes an injector region and an adjacent quantum well (gain region).

Layers 202, 204, and 206a comprise a first quantum cascade laser, layers 206b, 208b, and 210a comprise a second quantum cascade laser, and layers 210b, 212b, and 214 comprise a third quantum cascade laser (where each quantum cascade laser comprises an active region layer [first, second, and third, respectively] bounded by cladding layers such that the index of refraction of the respective active region layer is greater than the indices of refraction of the bounding cladding layers). Current is injected into the first quantum cascade laser by applying a voltage difference to metal contact layers 216 and 218. Similarly, a voltage difference applied to metal contact layers 220 and 222 provides current to the second quantum cascade laser, and a voltage difference applied to metal contact layers 224 and 226 provides current to the third quantum cascade laser. These three voltage differences may be applied independently of each other. This allows individual control of each quantum cascade laser.

Figure 3:
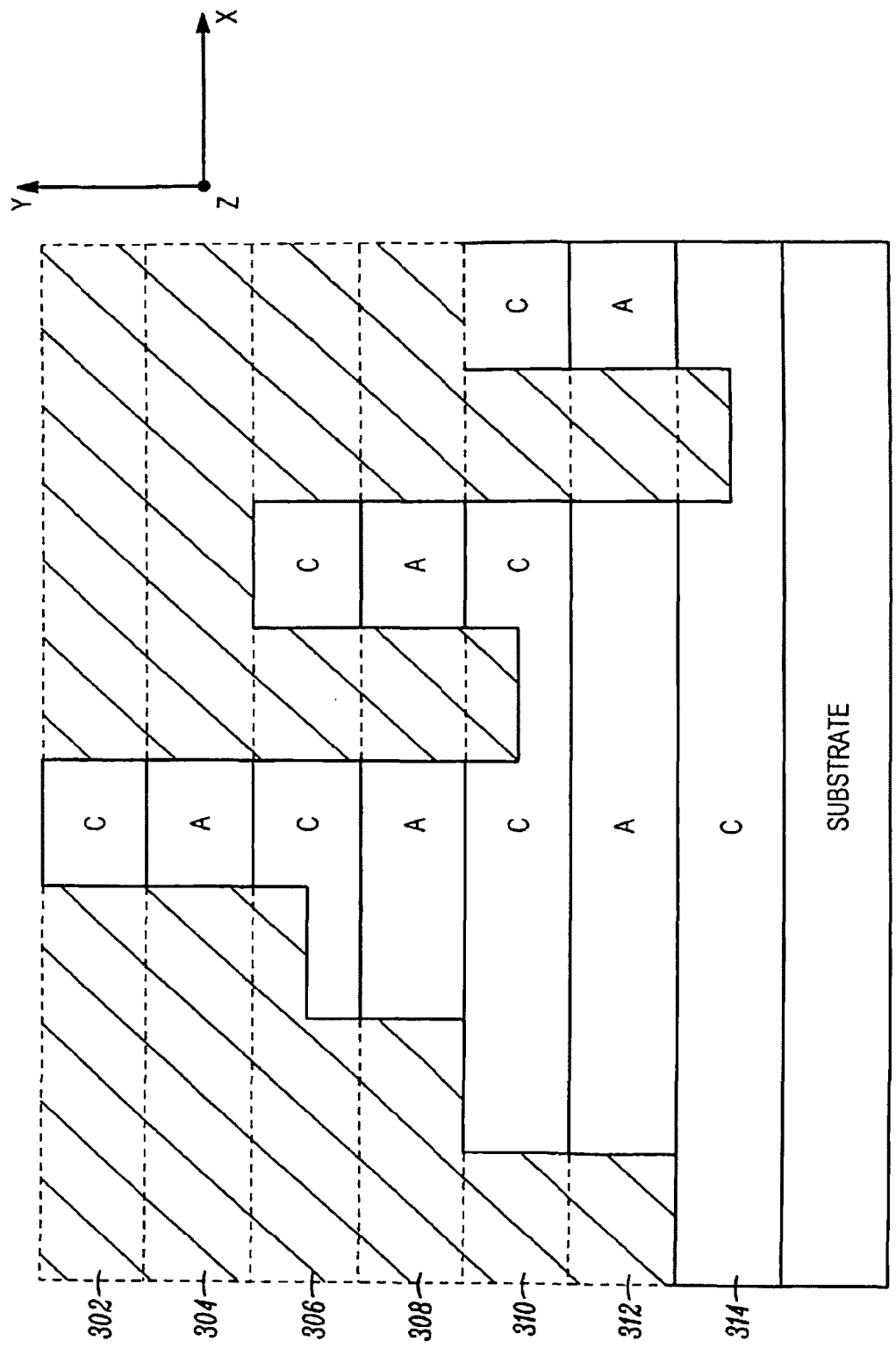

The three quantum cascade lasers shown in FIG. 2 are formed from a single monolithic structure comprising various layers of cladding and active regions. This is made clear by referring to FIG. 3, where the crosshatched region denotes that portion of the monolithic structure which has been etched away. Note that in FIG. 3 the metal contact layers are not shown. In FIG. 3, layers 302 through 314 are alternating layers of cladding and active regions. The correspondence between the layers in FIG. 3 and the layers in FIG. 2 is easily made. Cladding layer 202 in FIG. 2 is that part of cladding layer 302 remaining after an etching process. Active region layer 204 in FIG. 2 is that part of active region layer 304 in FIG. 3 remaining after the etching process. Cladding layers 206a and 206b in FIG. 2 are those parts of cladding layer 306 remaining after the etching process.

Continuing with making the correspondence between FIG. 2 in FIG. 3, active region layers 208a and 208b are formed from the active region layer 308, cladding layers 210a and 210b are formed from cladding layer 310, active region layers 212a and 212b are formed from active region layer 312, and cladding layer 214 is formed from cladding layer 314. Metal contact layers 216, 218, 220, 222, 224, and 226 are formed by depositing metal on their respective layers. Standard semiconductor processing techniques may be used to form the structure indicated in FIG. 2 from the monolithic structure indicated in FIG. 3.

It is a matter of semantics whether one may consider layers 206a and 206b to be two distinct layers or one layer, for they are formed from the same layer (306) by an etching process. Similar remarks apply to some of the other layers, such as for example layers 208a and 208b which are formed from the single layer 308, and so forth. However, note that active region layer 208a does not play an active role in the quantum cascade laser formed from layers 202, 204, and 206a, nor does it play an active role in the quantum cascade laser formed from layers 206b, 208b, and 210a. Because of the etching process, layer 208a is electrically isolated from (i.e., not in electrical contact with) active layer 208b.

Figure 4:
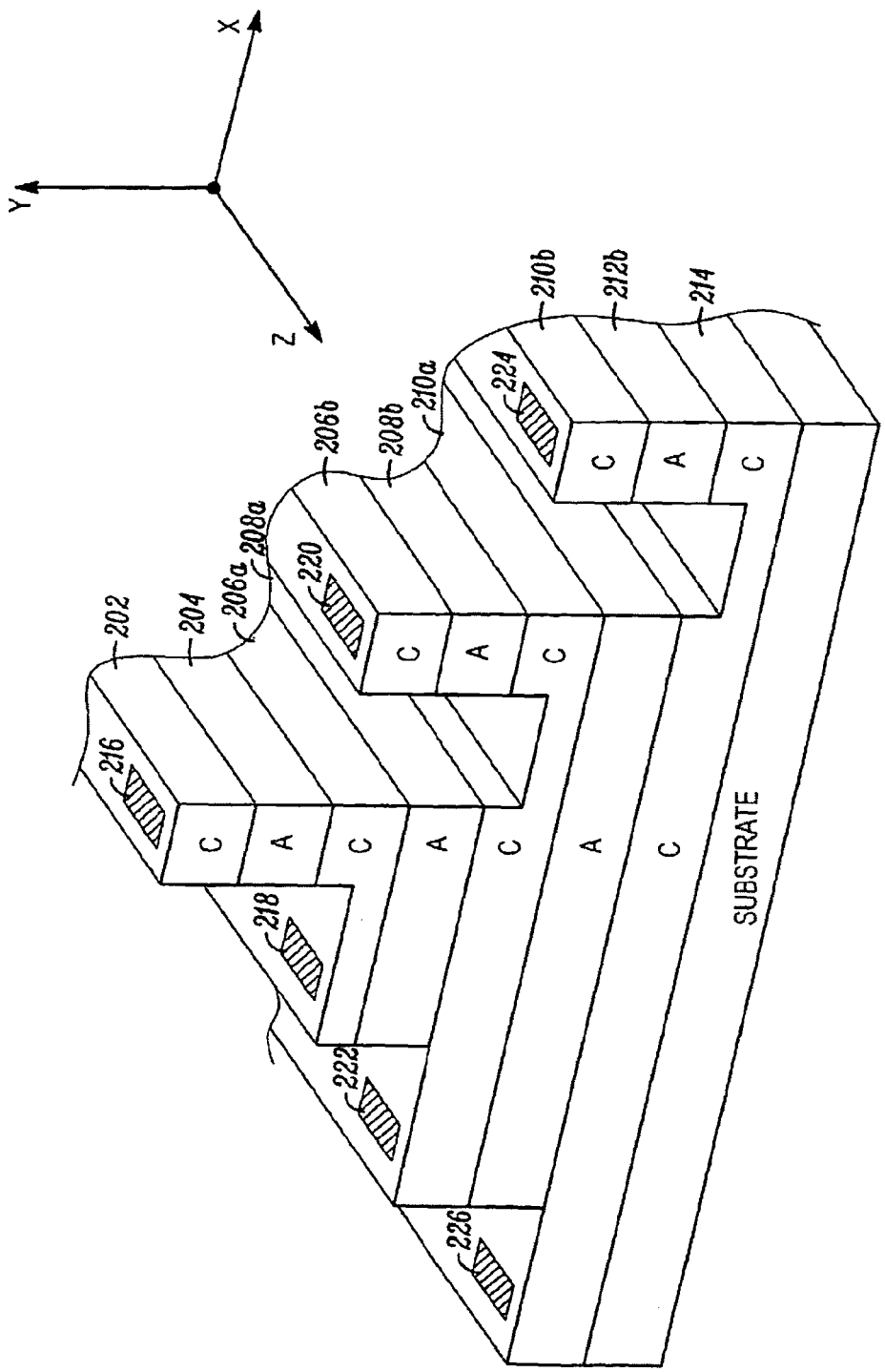
FIG. 4 illustrates a perspective view of a quantum cascade laser according to an embodiment.

A simplified perspective view of the embodiments of FIG. 2 is illustrated in FIG. 4. The numerals in FIG. 2 indicating the various components of the embodiment are also used in FIG. 4 to denote the same components. Note the orientation of the XYZ coordinate system in FIG. 4 relative to that of the previous figures. Propagation is along the z-axis direction. For other embodiments, an etching process may be used so that the shapes of cladding layers 206a, 210a, and 214, and the layers beneath them, are such that contacts 218, 212, and 226 may be placed to the right of their respective quantum cascade lasers, where the "right" direction may be taken along the positive x-axis direction of the XYZ coordinate system.

One exemplary embodiment of the invention (which corresponds to FIGS. 2-4) includes a first quantum cascade laser comprising a first active region layer bounded by cladding layers such that an index of refraction of the first active region layer is greater than the indices of refraction of the bounding cladding layers of the first active region layer and a second quantum cascade laser comprising a second active region layer bounded by cladding layers such that an index of refraction of the second active region layer is greater than the indices of refraction of the bounding cladding layers of the second active region layer. An electrically isolated active region layer is adjacent to and in contact with one of the bounding cladding layers of the first quantum cascade laser and one of the bounding cladding layers of the second quantum cascade laser. The electrically isolated active region layer and the active region layer of the second quantum laser are formed from a same layer by an etching process and the electrically isolated active region layer does not play an active role in the first quantum cascade laser or the second quantum cascade laser. Emission wavelength of the first and the second quantum cascade laser may be controlled by the thickness of the first and the second active region layer, respectively. This conveniently allows one material to be used for the first and the second active region layers. To operate the laser device, current is injected into each quantum cascade laser by applying a voltage difference between the bounding cladding layers of the respective active regions. Each of the bounding cladding layers is electrically isolated from the other bounding cladding layers of all other quantum cascade lasers.

The foregoing described monolithic laser structure may further include a third quantum cascade laser comprising a third active region layer bounded by cladding layers such that an index of refraction of the third active region layer is greater than the indices of refraction of the bounding cladding layers of the third active region layer. Similarly here, a second electrically isolated active region layer is adjacent to and in contact with one of the bounding cladding layers of the second quantum cascade laser and one of the bounding cladding layers of the third quantum cascade laser. The second electrically isolated active region layer and the active region layer of the third quantum laser are formed from a same layer by an etching process and the second electrically isolated active region layer does not play an active role in the second quantum cascade laser or the third quantum cascade laser. The first quantum cascade laser has a quantum well with a first energy bandgap, the second quantum cascade laser has a quantum well with a second energy bandgap, and the third quantum cascade laser has a quantum well with a third energy bandgap. All the energy bandgaps are different from each other. The first quantum cascade laser may be tuned to provide electromagnetic radiation having a first wavelength, the second quantum cascade laser tuned to provide electromagnetic radiation having a second wavelength, and the third quantum cascade laser tuned to provide electromagnetic radiation having a third wavelength, where the first, second, and third wavelengths are different from each other.

Similarly, another exemplary embodiment of the invention (which also corresponds to FIGS. 2-4) includes a first cladding layer and a first active region layer formed on the first cladding layer and comprising a quantum well and an injector to inject electrons into the quantum well. The first active region layer is etched into a first part and a second part not in contact the first part. A second cladding layer is formed on the first active region layer. The second cladding layer is etched into a first part and a second part not in contact with the first part of the second cladding layer. The first part of second cladding layer is in contact with the first part of the first active region layer, and the second part of the second cladding layer is in contact with the second part of the first active region layer. In addition, a second active region layer is formed on the second cladding layer and comprising a quantum well and an injector to inject electrons into the quantum well of the second active region layer, the second active region layer etched to not contact the second part of the second cladding layer. Finally, a third cladding layer is in contact with the second active region layer. A first quantum cascade laser comprises the third cladding layer, the second active region layer and the first part of the second cladding layer. A second quantum cascade laser comprises the second part of the second cladding layer, the second part of the first active region layer and the first cladding layer. In addition, the first part of the first active region layer comprises an electrically isolated active region layer that does not play an active role in the first quantum cascade laser or the second quantum cascade laser. The first, second, and third cladding layers have indices of refraction, and the first and second active region layers have indices of refraction such that the index of refraction of the first active region layer is greater than the indices of refraction of the first and second cladding layers. Similarly, the index of refraction of the second active region layer is greater than the indices of refraction of the second and third cladding layers. The emission wavelength of the first and the second quantum cascade laser is controlled by a thickness of the first and the second active region layer, respectively, and one material may be used for the first and the second active region layer. Current is injected into each quantum cascade laser by applying a voltage difference between the bounding cladding layers of the respective active regions and each of the bounding cladding layers is electrically isolated from the other bounding cladding layers of all other quantum cascade lasers.

The foregoing apparatus may further include a first metal contact formed on the first cladding layer, a second metal contact formed on the first part of the second cladding layer, a third metal contact formed on the second part of the second cladding layer, and a fourth metal contact formed on the third cladding layer. The quantum well of the first active region layer has a first energy bandgap, and the quantum well of the second active region layer has a second energy bandgap different than the first energy bandgap.

Yet another exemplary embodiment of a monolithic QC laser structure (which again corresponds to FIGS. 2-4) may include a first cladding layer, a first active region layer adjacent to the first cladding layer and comprising an injector and a quantum well, a second cladding layer comprising a first part and a second part not in electrical contact with the first part, the first part adjacent to the first active region layer, a second active region layer comprising a first part and a second part not in electrical contact with the first part of the second active region layer, the second part of the second active region layer adjacent to the second part of the second cladding layer and comprising an injector and a quantum well, and a third cladding layer adjacent to the first and second parts of the second active region layer. A first quantum cascade laser comprises the first cladding layer, the first active region layer and the first part of the second cladding layer, a second quantum cascade laser comprises the second part of the second cladding layer, the second part of the second active region layer and the third cladding layer. The first part of the second active region layer comprises an electrically isolated active region layer that does not play an active role in the first quantum cascade laser or the second quantum cascade laser. The first, second, and third cladding layers having indices of refraction, and the first and second active region layers having indices of refraction, wherein the index of refraction of the first active region layer is greater than the indices of refraction of the first and second cladding layers, and the index of refraction of the second active region layer greater than the indices of refraction of the second and third cladding layers. Emission wavelength of the first and the second quantum cascade laser may be controlled by a thickness of the first and the second active region layer, respectively, and one material is used for the first and the second active region layer. To operate, current is injected into each quantum cascade laser by applying a voltage difference between the bounding cladding layers of the respective active regions and each of the bounding cladding layers is electrically isolated from the other bounding cladding layers of all other quantum cascade lasers. The quantum well of the first active region layer has a first energy bandgap, and the quantum well of the second active region layer has a second energy bandgap different from the first energy bandgap. The quantum well of the first active region layer has a first energy bandgap, and the quantum well of the second active region layer has a second energy bandgap different from the first energy bandgap.

The foregoing apparatus may further include a first metal contact formed on the first cladding layer, a second metal contact formed on the first part of the second cladding layer, a third metal contact formed on the second part of the second cladding layer, and a fourth metal contact formed on the third cladding layer. The quantum well of the first active region layer has a first energy bandgap, and the quantum well of the second active region layer has a second energy bandgap different from the first energy bandgap.

For some embodiments, a typical cross-sectional size for a ridge waveguide quantum cascade laser is about 1.5 μm wide by about 14 μm high, where width refers to the x-axis direction and height refers to the y-axis direction. Although not shown in FIG. 4. Bragg diffraction gratings may be formed on each of the top cladding layers for each quantum cascade laser so that a single waveguide mode is amplified in each quantum cascade laser. For each quantum cascade laser, a high reflective coating may be formed on a face, where the other face serves as a partial reflector, so that an optical cavity, such as for example a Fabre Perot cavity, may be realized. (The faces are parallel to the x-y plane.) For some embodiments the cavity length for each quantum cascade laser may be on the order of 1.5 mm to 3 mm. For some embodiments the separation between each quantum cascade laser may be about 50 μm. The height of the overall structure depends upon how many quantum cascade lasers are formed, but a typical height for some embodiments may be about 100 μm.

The ridge waveguide quantum cascade lasers and metal contact pads may be defined by a combination of photolithographic patterning, dry and wet etching, oxide and metal evaporation, and MOCVD (metal-organic chemical vapor deposition) epitaxial growth. Various materials may be used for the cladding layers, the injectors and quantum wells within the active region layers, and the substrate. The materials for the cladding layers and active region layers may be lattice strained or lattice matched to their respective substrates.

For some embodiments, the compounds InP, GaAs, or GaSb may be used for a substrate. Superlattice structures may be used in the cladding layers and active region layers. Particular examples include a GaInAs/AlInAs (gallium indium arsenide/aluminum indium arsenide) heterostructure on an InP substrate; an AlGaAs/GaAs (aluminum gallium arsenide/ gallium arsenide) heterostructure on a GaAs substrate; and an AlGaSb/InAs (aluminum gallium antimonide/indium arsenide) heterostructure on a GaSb substrate. Further examples include a superlattice composition of GaInAs/AlInAs for a quantum cascade laser on an InP substrate; a superlattice composition of AlSb/InAs for a quantum cascade laser on a GaSb substrate; and a superlattice composition of AlGaAs/ GaAs for a quantum cascade laser on a GaAs substrate. Of course, these are just particular examples for the materials which may be used in an embodiment. Other materials may be used in other embodiments. Typical wavelengths for the laser radiation may be in the range of 5 μm to 20 μm.

As discussed earlier, each of the quantum cascade lasers making up an embodiment may be individually controlled by way of the applied voltage potentials. Because of this, it is expected that embodiments may find numerous applications in which a mid-to far infrared broadband laser source is desired. For example, an embodiment may be used in a frequency division multiple access communication system, where each of the individual ridge waveguide quantum cascade lasers are turned on and off in some specified fashion.

2. Exemplary Embodiments of Integrated Broadband QC Laser

As discussed above embodiments of the present invention encompass monolithic integration of extremely broadband (e.g. greater than 15 μm bandwidth) mid-infrared quantum cascade (QC) lasers that overcome the narrow band spectral limitation of a single laser. In addition, embodiments of the invention offer several orders of magnitude higher optical power, spectral density and brightness compared to thermal IR light sources. An important feature of the invention is the particular monolithically integrated array structure of individually controlled QC lasers structures on top of one another. This monolithically integrated structure provides several advantages. Wider spectral coverage is delivered due to the ability to monolithically integrate stacks of semiconductor layers that are designed to emit at different wavelengths on top of each other. Wavelength multiplexing may also be achieved by operating the separate lasers of the monolithic stack individually and/or simultaneously using electronic biasing voltage on each integrated channel. Wavelength tunability may also enable by temperature and changing drive current of the individual lasers (~0.1 micron for each individual laser channel). Embodiments of the invention also afford compactness and robustness through the monolithically integrated architecture.

As previously described, embodiments of the present invention employ a novel architecture applied to QC laser devices. The architecture enables greatly improved manufacturability for extremely broadband (e.g. greater than 15 micron) mid-IR sources. An important feature of the invention is the ability to monolithically integrate an array of individually controlled QC lasers on top of one another in an efficient development process. The vertically integrated QC lasers are made individually addressable by then isolating laterally the different QC lasers from one another employing the architecture described in the previous section.

This vertically integrated and laterally isolated monolithic QC laser structure enables optical sources that can emit light simultaneously at multiple discrete wavelengths with uniform wavelength spacing that together can cover a full 5 to 20 micron wavelength band. Embodiments of the present invention rely on a key property of semiconductor QC laser. Unlike traditional crystalline and gaseous lasers, the emission wavelength of the QC laser is not set by the physical properties of semiconductor material (i.e. bandgap). With such QC lasers, the emission wavelength is determined (and therefore may be selected) by thickness of the semiconductor epitaxial layer (i.e. the active region layer). This unique property enables the efficient vertical integration of the laser structures of the present invention through molecular beam epitaxy (MBE) growth of a common material for each of the active region layers. Thus, determination of the particular wavelengths for each separate QC laser of the integrated monolithic structure is simplified to active region layer thickness engineering rather than complex material intermixing as with other laser types.

Figure 5:
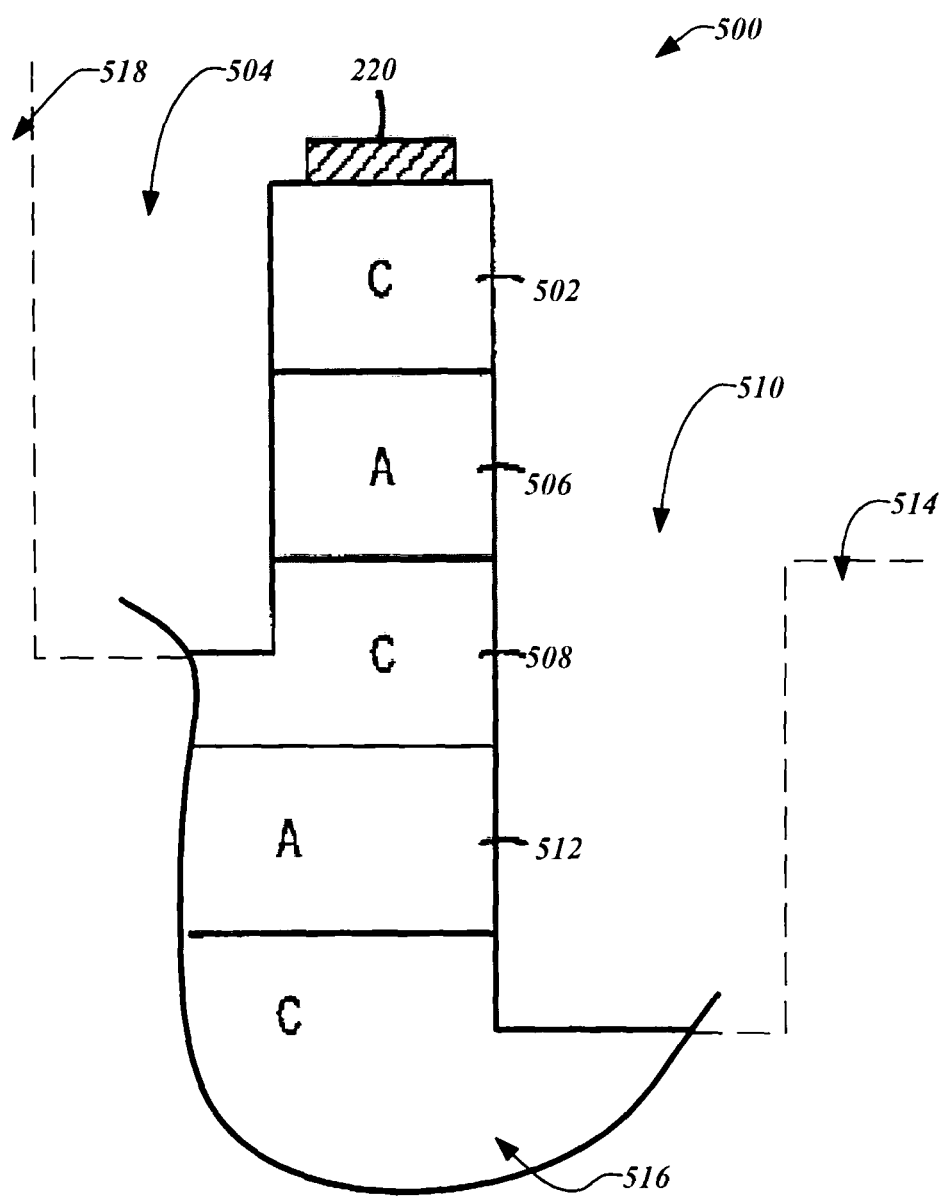
FIG. 5 illustrates a generalized separately addressable QC laser from within a quantum cascade laser embodiment consistent with the embodiment FIGS. 2-4.

FIG. 5 illustrates a generalized separately addressable QC laser 500 from within a monolithic quantum cascade laser embodiment consistent with the embodiments FIGS. 2-4. The embodiments of FIGS. 2-4 are shown depicting three separately addressable QC lasers. However, embodiments of the invention are applicable to a monolithic laser structure employing any number of separately addressable QC lasers. In broad strokes, production of the overall structure involves first, vertical growth of alternating cladding and active region layers and then second, lateral selective etching to yield the separately addressable QC lasers. The result is that each separately addressable QC laser within the interior of the monolithic quantum cascade laser is identical.

As previously described regarding FIG. 3, the monolithic structure begins by growing alternating cladding and active region layers on a substrate. A plurality of cladding layers are vertically interleaved with a plurality of active region layers such that the plurality of cladding layers and the plurality of active region layers are alternating and a pair of the plurality of cladding layers bound each of the plurality of active region layers. The active region layers are all formed with the same (common) material (e.g. a specific superlattice heterostructure) and the thicknesses of the active region layers are distinct from one another and predetermined to yield a QC laser with a particular emission wavelength. Use of the common material and employing only thickness variation in the active region layers enable very efficient production of the device.

Etching is performed to yield each separately addressable QC laser 500. Each QC laser 500 is defined by etching to expose the top of the upper cladding layer 502 in the area of the particular QC laser 500, one etched trench 504 on one side (the left) of the QC laser 500 and a second etched trench 510 (opposite the first trench 504) which both penetrates through the upper cladding layer 502, and the active region layer 506 (to isolate the portion that will become the QC laser 500). The first trench 504 may also penetrate just a portion of the lower cladding layer 508 and then stop. The second trench 510 (on the right) penetrates further through the lower cladding layer 508 and then also through the active region layer 512 of the adjacent QC laser 514 (shown in phantom on the right). The second trench 510 may also penetrate just a portion of the lower cladding layer 516 of the adjacent QC laser 514 and then stop. (Note that the second trench 510 is analogously the "first trench" for the adjacent QC laser 514.) The etching process leaves the upper cladding layer 502 portion that bounds the active region layer 506 portion with the lower cladding layer 508 to form the QC laser 500. Note that "left" and "right" are arbitrary references to the particular figures; the only distinction is between the two opposite sides of each QC laser as will be understood by those skilled in the art.

Repeatedly etching laterally across the layers in the manner described above will produce the plurality of QC lasers of the structure. It is important to notice that the process results in the active region layer 506 being eliminated on the right side for each QC laser 500 but the isolated remainder of the active region layer 506 to left supports the laser stack of all QC lasers 518 on the left side of each QC laser 500. See e.g. FIG. 2. In addition, the lower cladding layer 508 for each interior QC laser 500 also supports the laser stack on the left side but also serves to electrically couple the particular QC laser 500 so that it may be separately addressable by applying voltage between the lower cladding layer 508 and the upper cladding layer 502.

It is also important to notice that for any interior QC laser 500, etching the lower cladding layer 508 on the right side to create the QC laser 500 simultaneously separates the portion of the lower cladding layer 508 that becomes the "upper" cladding layer portion for the adjacent QC laser 514. This simultaneous etching to yield both the lower cladding layer for a QC laser 500 and the upper cladding layer portion for the adjacent QC laser further enhances production efficiency for the described architecture. Furthermore, the overall etching process also provides that each separate QC laser 500 is electrically isolated from all other QC lasers in the stack; the isolated remainder of the active region layers 506 to the left serves to electrically insulate the electrical channels to separate QC lasers from one another.

The QC lasers at the left and right ends of the overall structure have only superficial differences in that the leftmost QC laser (illustrated in FIG. 2) has the bottom cladding layer contact for each QC laser to its left (which may be exposed by etching steps to each cladding layer) and the rightmost QC laser (also illustrated in FIG. 2) has its lower cladding layer disposed directly on the supporting substrate for the device (rather than the isolated remainder of an adjacent QC laser). Emission from each separately addressable QC laser may be activated by applying an independent voltage between an upper contact on the upper bounding cladding layer portion and a lower contact on the lower bounding cladding layer. The lower contacts may be disposed on exposed portions of the lower bounding cladding layers electrically coupled under the stack of all QC lasers on one side (e.g. left side) of the device. The lower bounding cladding layers electrically coupled under the stack of all QC lasers are electrically insulated from one another by the interleaved isolated remainder of the active region layers 506.

As previously discussed the distinct wavelengths of each QC laser are a function of the thickness of the particular active region layer portion for the QC laser. These thicknesses are selected such that the emission wavelengths for the QC lasers provide adjacent and slightly overlapping bandwidths that are combined to yield the overall broadband emission. The bandwidth for each individual QC laser in the stack may be engineered as a function of the common material and/or active region layer design as will be understood by those skilled in the art. In one example, each QC laser may have a bandwidth of about 5 microns and different active region layer thicknesses such that they deliver distinct wavelengths from one another less than 5 microns apart (to provide some overlap). Thus, when three or four distinct QC lasers are combined in the monolithic structure and multiplexed together the overall device can produce approximately 15 microns of bandwidth for a three QC laser structure up to approximately 20 microns of bandwidth for a four QC laser structure. Selective operation of the independent voltages and temperature may also be utilized for further tuning as will be appreciated by those skilled in the art.

The described laser sources can be a key enabling technology for realization of a variety of in-situ instruments for ultra-sensitive chemical detection, mid-IR microscopic spectral imaging and short-range remote sensing, for example. A microscopic spectral imaging instrument that would replicate the spatial resolution of a microscopic imager (MI) (i.e. similar to those employ on Mars rovers. "Spirit" and "Opportunity") and would allow retrieval of mid-infrared (mid-IR) reflectance spectra to identify the mineralogy of primary and aqueous materials on Mars and other solar objects is needed.

Employing an embodiment of the invention, snapshots of the geological context over a $cm^2$ area can be captured with an ample signal-to-noise ratio with spatial resolution better than 30 micron/pixel and spectral resolution better than 10 nm in a single frame. The captured snapshots at different wavelengths recorded by a focal plane array (FPA) detector can be reconstructed into a cube of spatial (x, y) and spectral (wavelength) information. This information can then enable scientists to obtain a detailed chemical composition and microscopic textural maps of mineral surfaces. Currently, such capability does not exist.

The described laser structure and enabled microscopic spectral imaging instrument concept builds upon decades of effort to understand the composition and morphology of planetary surfaces in our solar system. The instrument can further assist to address the key geological questions regarding water related history (the presence of carbonates and identification and structures of phyllosilicates and goethite) on the surface of Mars. The Mars exploration program has as its prime objective determining where there are sites that may have been modified by water and may have had life develop and evolve. This instrument can also be used as an analytical tool for analyzing the crushed rocks, core samples from the sub surface of planets, and/or drill cuttings. The operation of the instrument is largely independent of temperature and solar illumination of the surface. Thus, this powerful and versatile instrument can be used for study of various objects in the solar system such as cold planets, moons, comets and asteroids.

Compared with typical thermal IR sources, the wavelength coverage of a single QC laser in would be inadequate due to its narrow waveband. These QC laser structures can offer several orders of magnitude higher optical power, spectral density and brightness in comparison to the typical thermal IR sources in the 3 to 20 micron wavelength region. However, such lasers are often too bulky, complex and are based on technology too unreliable for space applications. Thus, other multiplexing approaches are needed to yield a miniaturized, compact, robust, and reliable broadband laser source in the mid-IR wavelength region. Accordingly, a monolithically integrated embodiment employing the structure previously described of many tunable tunable QC lasers operating at different wavelengths and multiplexed together can cover a sufficiently large waveband.

4. Exemplary Method of Forming an Integrated QC Laser Structure

Figure 6:
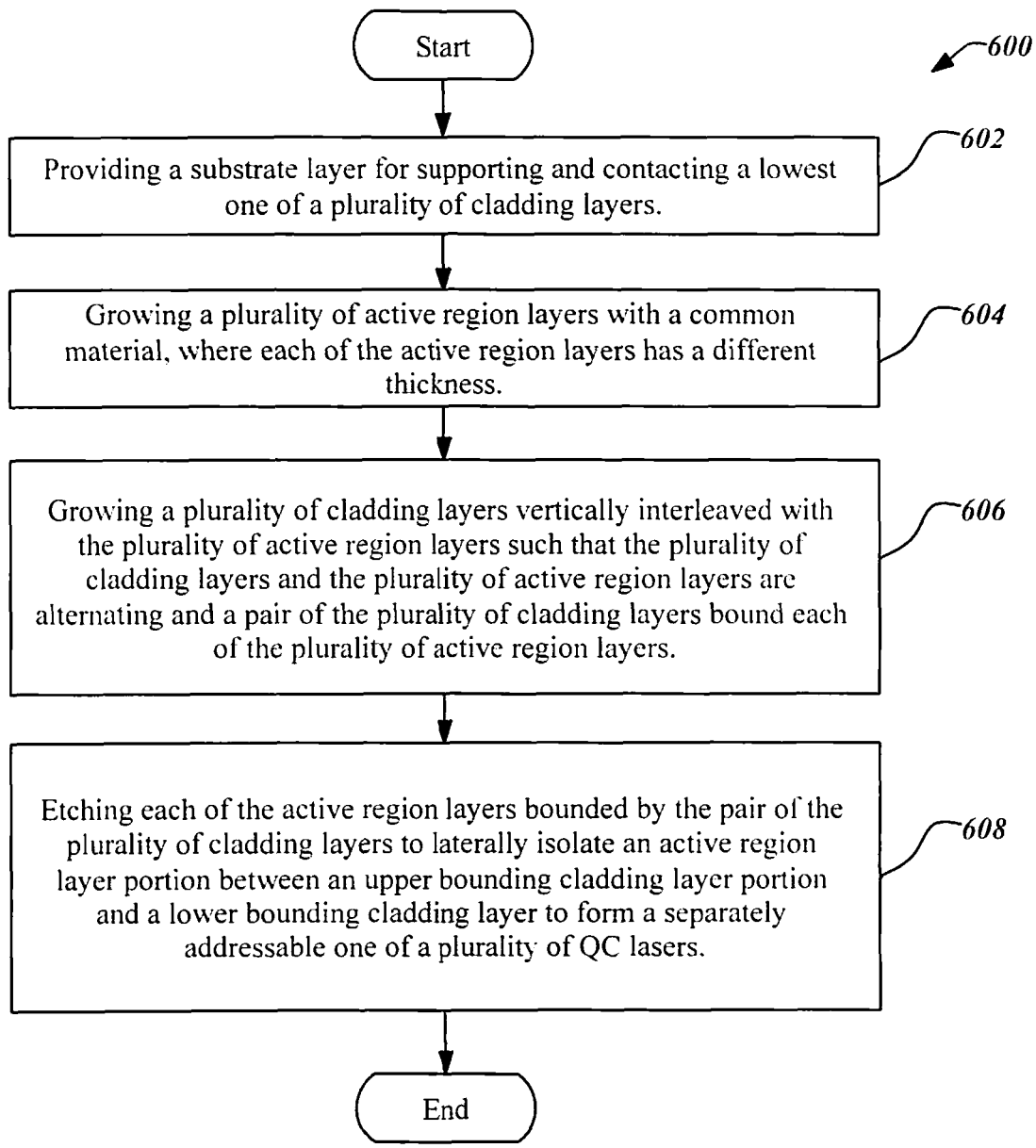
FIG. 6 is a flowchart of an exemplary method forming a monolithic quantum cascade laser structure in accordance with an embodiment of the invention.

FIG. 6 is a flowchart of an exemplary method 600 of forming a monolithic quantum cascade laser structure in accordance with an embodiment of the invention. In operation 602, a substrate layer provided for supporting and contacting a lowest one of a plurality of cladding layers. In operation 604, a plurality of active region layers are grown with a common (i.e. the same) material, where each of the active region layers has a different thickness. In operation 606, a plurality of cladding layers are grown vertically interleaved with the plurality of active region layers such that the plurality of cladding layers and the plurality of active region layers are alternating and a pair of the plurality of cladding layers bound each of the plurality of active region layers. In operation 608, each of the active region layers bounded by the pair of the plurality of cladding layers is etched to laterally isolate an active region layer portion between an upper bounding cladding layer portion and a lower bounding cladding layer to form a separately addressable one of a plurality of QC lasers. The method 600 may be further modified consistent with the apparatuses and material parameters previously described as will be understood by those skilled in the art. It is important to note that the order of operations may be readily altered as desired and/or necessary as will be understood by those skilled in the art. For example, operations 604 and 606 are performed together as the separate cladding and active region layers are alternately grown.

Operation of the resulting quantum cascade laser structure may be achieved by applying an independent voltage between an upper contact on the upper bounding cladding layer portion and a lower contact on the lower bounding cladding layer for each separately addressable one of the plurality of QC laser to produce the distinct emission wavelength. All of the distinct emission wavelengths for QC lasers are then multiplexed together to yield the broadband emission for the overall device, e.g. greater than 15 micron bandwidth.

This concludes the description including the preferred embodiments of the present invention. The foregoing description including the preferred embodiment of the invention has been presented for the purposes of illustration and description. It is not intended to be exhaustive or to limit the invention to the precise forms disclosed. Many modifications and variations are possible within the scope of the foregoing teachings. Additional variations of the present invention may be devised without departing from the inventive concept as set forth in the following claims.

What is claimed is:

1. A monolithic quantum cascade (QC) laser structure, comprising:

a plurality of QC active region layers formed with a common material, where each of the QC active region layers has a different thickness;

a plurality of cladding layers vertically interleaved with the plurality of QC active region layers such that the plurality of cladding layers and the plurality of QC active region layers are individually alternating and a pair of the plurality of cladding layers bound each of the plurality of QC active region layers; and a substrate layer supporting and contacting a lowest one of the plurality of cladding layers;

wherein each of the QC active region layers bounded by the pair of the plurality of cladding layers is etched to laterally isolate an QC active region layer portion between an upper bounding cladding layer portion and a lower bounding cladding layer to form a separately addressable one of a plurality of QC lasers.

2. The apparatus of claim 1, wherein the common material of the plurality of QC active region layers comprises a superlattice semiconductor material.

3. The apparatus of claim 1, wherein an index of refraction of the QC active region layer portion is greater than that of the upper bounding cladding layer portion and the lower bounding cladding layer for each of the plurality of QC lasers.

4. The apparatus of claim 1, wherein emission from each separately addressable one of the plurality of QC lasers is activated by applying an independent voltage between an upper contact on the upper bounding cladding layer portion and a lower contact on the lower bounding cladding layer.

5. The apparatus of claim 1, wherein the different thickness of each of the QC active region layers determines a distinct emission wavelength for the separately addressable one of a plurality of QC lasers.

6. The apparatus of claim 5, wherein each separately addressable one of the plurality of QC lasers yields less than a 5 micron bandwidth.

7. The apparatus of claim 5, wherein the distinct emission wavelength for all of the plurality of QC lasers is multiplexed together to yield a broadband emission.

8. The apparatus of claim 7, wherein the broadband emission comprises greater than 15 micron bandwidth.

9. The apparatus of claim 5, wherein each of the QC active region layers are disposed such that the different thickness is greater than that of any of the plurality of QC active region layers below.

10. A method of forming a monolithic quantum cascade (QC) laser structure, comprising the steps of:
   growing a plurality of QC active region layers with a common material, where each of the QC active region layers has a different thickness;
   growing a plurality of cladding layers vertically interleaved with the plurality of QC active region layers such that the plurality of cladding layers and the plurality of QC active region layers are individually alternating and a pair of the plurality of cladding layers bound each of the plurality of QC active region layers;
   providing a substrate layer supporting and contacting a lowest one of the plurality of cladding layers; and
   etching each of the QC active region layers bounded by the pair of the plurality of cladding layers to laterally isolate an QC active region layer portion between an upper bounding cladding layer portion and a lower bounding cladding layer to form a separately addressable one of a plurality of QC lasers.

11. The method of claim 10, wherein the common material of the plurality of QC active region layers comprises a superlattice semiconductor material.

12. The method of claim 10, wherein an index of refraction of the QC active region layer portion is greater than that of the upper hounding cladding layer portion and the lower bounding cladding layer for each of the plurality of QC lasers.

13. The method of claim 10, wherein emission from each separately addressable one of the plurality of QC lasers is activated by applying an independent voltage between an upper contact on the upper bounding cladding layer portion and a lower contact on the lower bounding cladding layer.

14. The method of claim 10, wherein the different thickness of each of the QC active region layers determines a distinct emission wavelength for the separately addressable one of a plurality of OC lasers.

15. The method of claim 14, wherein each separately addressable one of a plurality of QC lasers yields less than a 5 micron bandwidth.

16. The method of claim 14, wherein the distinct emission wavelength for all of the plurality of QC lasers is multiplexed together to yield a broadband emission.

17. The method of claim 16, wherein the broadband emission comprises greater than 15 micron bandwidth.

18. The method of claim 14, wherein each of the QC active region layers are disposed such that the different thickness is greater than that of any of the plurality of QC active region layers below.

* * * * *